US006781445B2

(12) United States Patent
Feldman

(10) Patent No.: US 6,781,445 B2
(45) Date of Patent: Aug. 24, 2004

(54) LOW POWER LARGE SIGNAL RF TUNED BUFFER AMPLIFIER

(75) Inventor: Arnold R. Feldman, San Francisco, CA (US)

(73) Assignee: Zeevo, Inc., Santa Clara, CA (US)

( * ) Notice: Subject to any disclaimer, the term of this patent is extended or adjusted under 35 U.S.C. 154(b) by 0 days.

(21) Appl. No.: 09/835,021

(22) Filed: Apr. 13, 2001

(65) Prior Publication Data

US 2002/0149419 A1 Oct. 17, 2002

(51) Int. Cl.[7] .......................... H03F 3/193; H03F 3/45

(52) U.S. Cl. .......................... 327/563; 327/65; 330/146

(58) Field of Search .......................... 327/110, 112, 327/65, 563, 557; 330/252, 253, 146, 207 A, 251

(56) References Cited

U.S. PATENT DOCUMENTS 4,117,415 A * 9/1978 Hoover .......................... 330/264
5,134,319 A * 7/1992 Yamaguchi .......................... 327/55
5,382,915 A * 1/1995 Muri et al. .......................... 330/10
5,410,280 A * 4/1995 Linguet et al. .......................... 330/10
5,483,207 A * 1/1996 Gabara .......................... 331/117 FE
5,539,334 A * 7/1996 Clapp, III et al. .......................... 327/318
5,539,342 A * 7/1996 Gersbach et al. .......................... 327/108
5,559,463 A * 9/1996 Denker et al. .......................... 327/300
5,869,988 A * 2/1999 Jusuf et al. .......................... 327/110
5,952,856 A * 9/1999 Horiguchi et al. .......................... 327/110
5,963,061 A * 10/1999 Briner .......................... 327/55
5,974,500 A * 10/1999 Maletsky et al. .......................... 711/103
6,072,362 A * 6/2000 Lincoln .......................... 330/251
6,137,319 A * 10/2000 Krishnamurthy et al. .......................... 327/51
6,211,728 B1 * 4/2001 Chen et al. .......................... 330/146
6,249,192 B1 * 6/2001 Gabara et al. .......................... 327/165
6,275,092 B1 * 8/2001 Maggio et al. .......................... 327/424

OTHER PUBLICATIONS

King–Chun Tsai et al., "A 1.9–GHz, 1–W CMOS Class–E Power Amplifier for Wireless Communications" IEEE Journal of Solid–State Circuits, vol. 34, No. 7, Jul. 1999, pp 962–970.

* cited by examiner

*Primary Examiner*—Timothy P. Callahan
*Assistant Examiner*—Terry L. Englund
(74) *Attorney, Agent, or Firm*—Townsend and Townsend and Crew LLP; J. Matthew Zigmant

(57) ABSTRACT

Methods and apparatus for buffering RF signals. A method includes receiving an input signal, wherein the input signal alternates between a first polarity and a second polarity. From the input signal, a first current is generated, wherein the first current is proportional to the input signal when the input signal has the first polarity, and approximately equal to zero when the input signal has the second polarity, and a second current is generated, wherein the second current is proportional to the input signal when the input signal has the second polarity, and approximately equal to zero when the input signal has the first polarity. A third current is generated proportional to the first current, and a fourth current is generated proportional to the second current. The first and fourth currents are applied to a first terminal of an inductor; and the second and third currents are applied to a second terminal of the inductor.

16 Claims, 10 Drawing Sheets

400
VDD
465
M6
M7
460
470
L1
VOUT-
VOUT+
445
480
455
VBIAS
435
IBIAS
405
415
VIN+
M4
M5
VIN-
425
440
450
490
C1
C2
495
422
R1
M1
M2
M3
410
420
VSS
475
430
432
R2

FOR OUTPUT SWING = 2·Z·ICS
POWER = VDD·ICS

LOW POWER LARGE SIGNAL RF TUNED BUFFER AMPLIFIER

BACKGROUND OF THE INVENTION

The present invention relates to wireless integrated circuits, specifically to tuned RF amplifiers.

We are presently in the midst of a wireless revolution. Mobile phones, once a novelty referred to as car phones, have become ubiquitous. Wireless personal data assistants, local and wide area networks, and computer connections are now everyday pieces of business equipment. Data and voice telecommunications have changed the structure of the economy, and have changed the way people live their lives. And now, a host of new products, enabled by the Bluetooth standard, are poised to enter a marketplace driven by the promise of a wireless Internet. The present invention provides important improvements to a key circuit used in wireless systems.

This circuit is a tuned RF amplifier. These amplifiers are useful in buffering and providing gain for oscillator, received, and transmit signals in RF integrated circuits.

Wireless devices typically transmit and receive data through the air on high frequency electromagnetic waveforms, though some systems, such as satellite dishes and pagers simply receive, and others merely transmit. Data transmission is begun by encoding the data to be transmitted. In Bluetooth systems, encoded data typically has a rate of 1.5 MHz and is used to modulate a high frequency electromagnetic carrier signal. This carrier signal is in the 2.44 GHz range. The modulated carrier signal is then applied to an antenna for broadcasting. The broadcast signal is referred to as a radio frequency (RF) signal. Data reception involves receiving the RF signal. The signal is then amplified, demodulated, filtered, and decoded.

RF integrated circuits often include a voltage controlled oscillator on-chip. The oscillator generates a local oscillator signal, which is buffered by an RF buffer amplifier and applied to a polyphase filter. Quadrature output signals are provided to receive and transmit mixers. The polyphase filters have a loss of 6 dB from input to output and have a minimum phase error when they receive a sinusoidal input.

Thus, what is needed is an RF buffer amplifier that can provide gain to compensate for the 6 dB loss, provide a sinusoidal output, and do so with a low power supply current. Such a buffer is useful for this, as well as several other functions in an RF integrated circuit.

SUMMARY OF THE INVENTION

Accordingly, embodiments of the present invention provide a power efficient RF buffer amplifier that filters signals and produces a large output swing. Specifically, p-channel loads provide a current "re-use" path, thereby reducing supply current by approximately half. These p-channel loads are connected in a positive feedback configuration to improve circuit gain and AC performance. The input devices are biased near cutoff, such that only one device conducts at a time, which further reduces supply current.

An exemplary embodiment of the present invention provides a method of buffering RF signals, including receiving an input signal, wherein the input signal alternates between a first polarity and a second polarity. From the input signal, a first current is generated, wherein the first current is proportional to the input signal when the input signal has the first polarity, and approximately equal to zero when the input signal has the second polarity, and a second current is generated, wherein the second current is proportional to the input signal when the input signal has the second polarity, and approximately equal to zero when the input signal has the first polarity. A third current is generated proportional to the first current, and a fourth current is generated proportional to the second current. The first and fourth currents are applied to a first terminal of an inductor, and the second and third currents are applied to a second terminal of the inductor.

A further embodiment of the present invention provides a circuit for buffering RF signals. The circuit includes a first switch coupled between a first supply node and a first output node, a second switch coupled between the first supply node and a second output node, a third switch coupled between the first output node and a second supply node, a fourth switch coupled between the second node and the second supply node, and an inductor coupled between the first output node and the second output node.

Yet a further exemplary embodiment of the present invention provides a circuit for buffering RF signals. The circuit includes a first device coupled between a first output node and a first supply node, where the first device has a control electrode coupled to a first input node and a second device coupled between a second output node and the first supply node, where the second device has a control electrode coupled to a second input node. Also included are a third device coupled between a second supply node and the first output node, where the third device has a control electrode coupled to the second output node, and a fourth device coupled between the second supply node and the second output node, where the fourth device has a control electrode coupled to the first output node. An inductor coupled between the first output node and the second output node is also included.

A better understanding of the nature and advantages of the present invention may be gained with reference to the following detailed description and the accompanying drawings.

DETAILED DESCRIPTION

Figure 1:
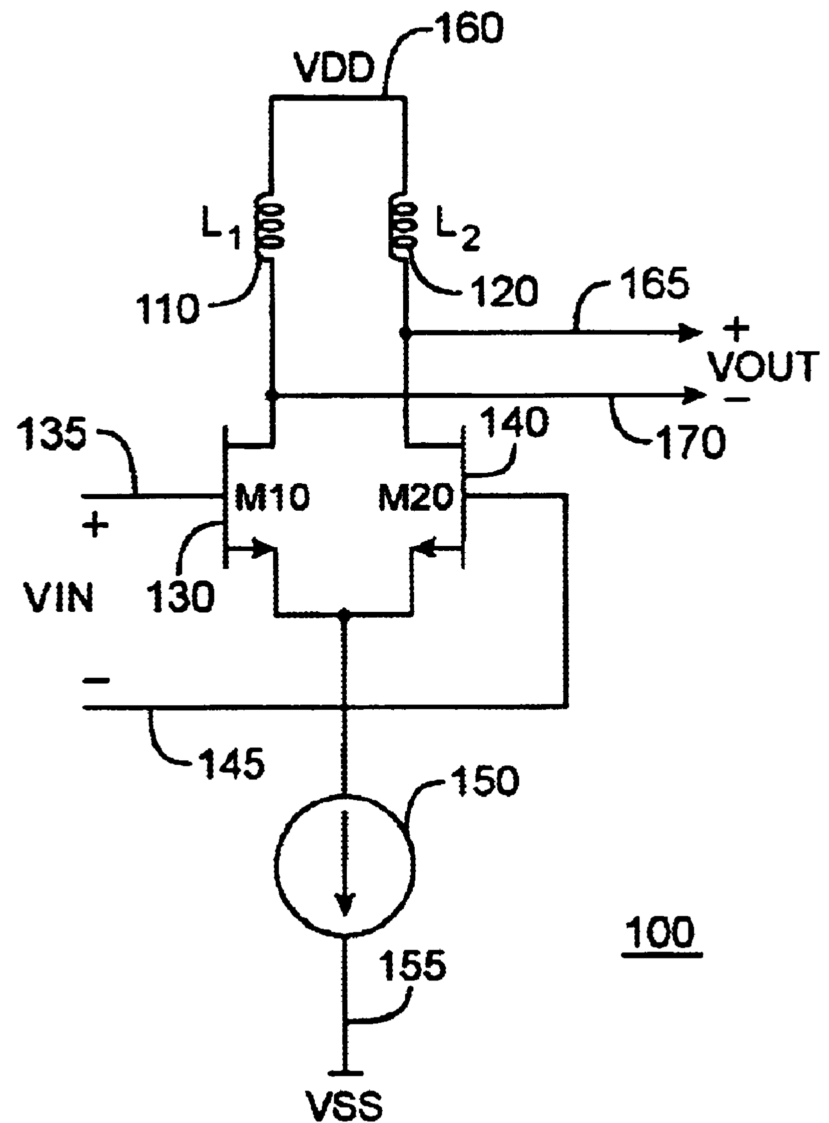
FIG. 1 is a schematic for a conventional RF buffer used in wireless circuits.

FIG. 1 is a schematic for a conventional RF buffer 100 used in wireless circuits. Included are differential pair M10 130 and M20 140, inductive loads L1 110 and L2 120, and current source 150. Current source 150 provides a bias current for the buffer. A first supply voltage VDD is applied on line 160, and a second supply voltage VSS is applied on line 155. An input voltage Vin between lines 135 and 145 is applied to the gates of devices M10 130 and M20 140. This differential input voltage creates a differential current in the drains of the input devices, which appears across the inductive loads, resulting in an output voltage Vout between lines 165 and 170. The terms line and node are used interchangeably throughout this document.

The performance of this RF buffer is limited. Specifically, this circuit has an undesirably high supply current. For example, when the input voltage in at a maximum such that the voltage on line 135 is much higher in the voltage on line 145, devices M10 130 conducts the current of the current source 150, steering it through load L1 110. This current does not pass through the second load device L2 120, thus the supply current is seen by only one half the differential load L1 110 and L2 120.

When the voltage Vin is near zero, the voltage on line 135 is equal to, or nearly equal to, the voltage on line 145, and the currents in devices M10 130 and M20 140 are approximately balanced. At this time, there is no differential current in the drains of the input devices, and the rate of change of current in the loads L1 110 and L2 1201. minimal. Thus, the bias current from current source 150 is wasted, since at this point it does not contribute to the output swing. Furthermore, this circuit has limited output voltage range. Since the loads are inductive, the output lines 165 and 170 swing above and below the supply voltage VDD provided on line 160. But there is a limit to how low an output node can swing. Specifically, if the voltage at line 170 decreases, device M10 130 enters its triode region, reducing the head room from current source 150, either reducing its output or shutting it off. Accordingly, Vin should be biased to provide sufficient head room for the operation of current source 150, and the output swing should be limited to avoid driving input devices M10 130 and M20 140 into their triode regions.

As can be seen, an RF buffer that makes better use of its supply current and provides a larger outfit swing is needed.

Figure 2:
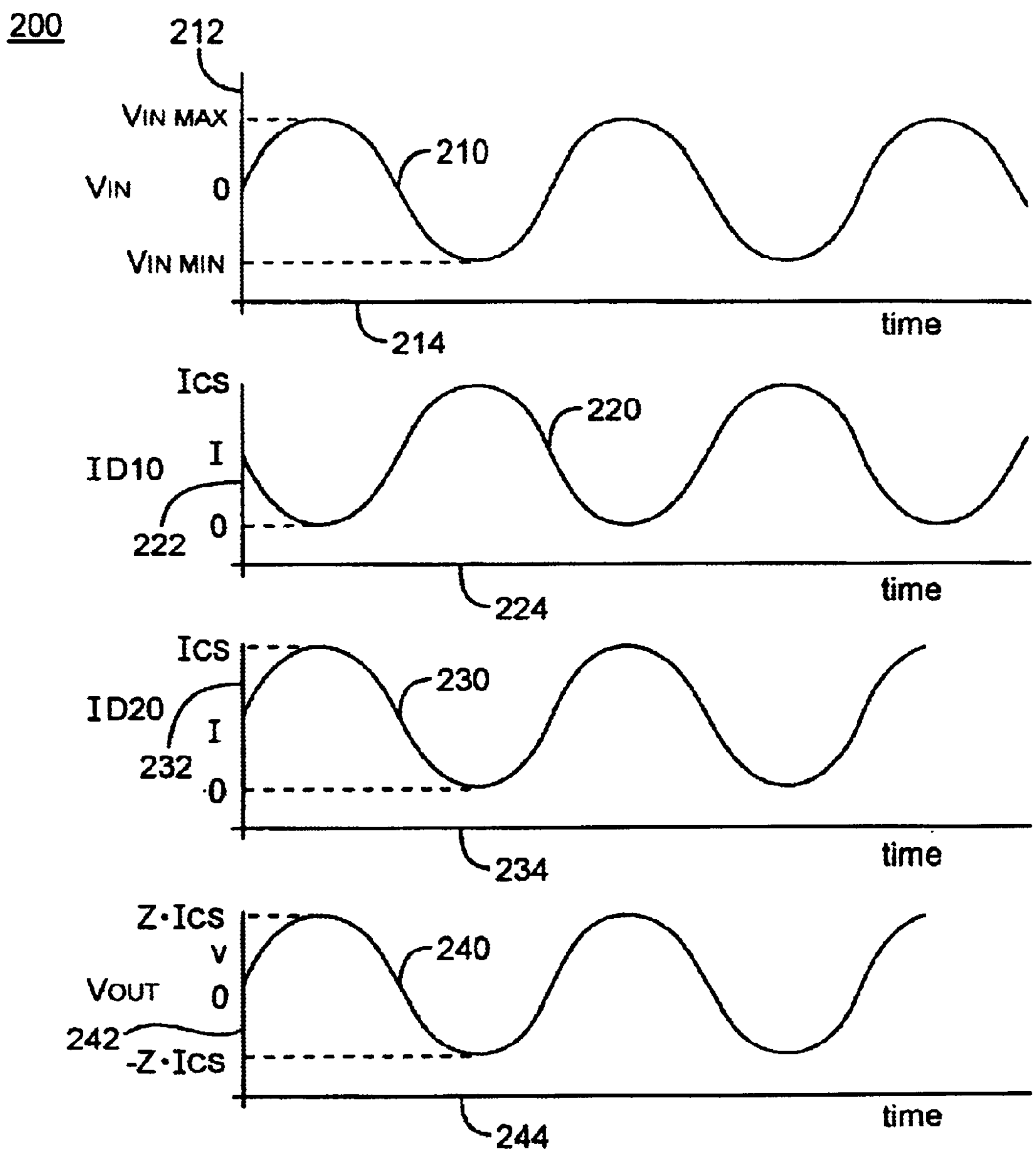
FIG. 2 shows the voltage and current waveforms at several nodes of the RF buffer of FIG. 1.

FIG. 2 shows the voltage and current waveforms at several nodes of the RF buffer of FIG. 1. Included are waveforms for the input voltage, the drain currents in the input devices, and the output voltage. An exemplary input voltage Vin 210 is shown as a differential signal, that is, the voltage on line 145 is subtracted from the voltage on line 135, and the result is plotted along a Y axis 212 corresponding to voltage, and an X 214 axis corresponding to time. Vin has a maximum value indicated as Vinmax, a minimum value labeled Vinmin, and an average value of zero.

The drain currents of devices M10 130 and M20 140 are shown as waveforms 220 and 230 respectively. Each current is plotted against a Y axis, 222 and 232, corresponding to current amplitude, and an X axis, 224 and 234, corresponding to time. If the input voltage is of sufficient magnitude, then each current waveform has a maximum value of the current in current source 150, ICS, and a minimum value of zero. These two current waveforms are 180 degrees out of phase with each other. The current waveform in M10 130 is out of phase with the input voltage Vin, while the drain current of M20 140 is in phase.

These currents appear across load inductors L1 110 and L2 120, where they generate the differential output voltage 240. Waveform 240 is equal to the voltage at line 170 subtracted from the voltage on line 165. This output is plotted against a Y axis 242 corresponding to voltage amplitude, and an X axis 244 which corresponds to time. The single-ended current across each inductor generates a voltage having an average value of the supply voltage VDD provided on line 160, and a swing equal to the product of ICS and the impedance of the inductor. The impedance of the inductor is $2\pi fL$, where f is the frequency of current waveforms 220 and 230, and L is the value of the inductor in Henrys. For low frequencies, the phase of the voltage waveform appears to lead the phase of the current in the inductors. At higher frequencies, the capacitance seen by the inductor shifts the phase of the voltage waveform towards the current waveform, and at some frequency they are aligned. At this frequency, the impedance of the inductor and the impedance of the capacitances at the drains are equal, and the buffer is said to be tuned. The capacitances include the actual capacitance of the drain, the drain to gate capacitance, interconnect and stray capacitances, as well as the parasitic capacitance of the inductor.

Figure 3:
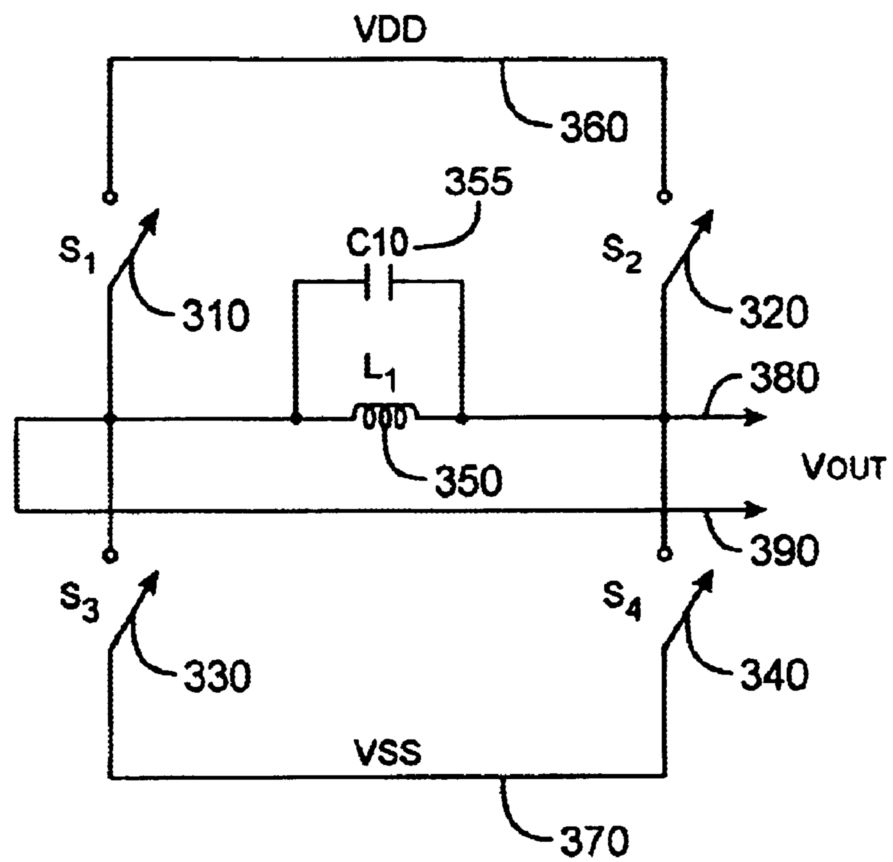
FIG. 3 is a simplified schematic for an RF buffer amplifier consistent with an embodiment of the present invention.

FIG. 3 is a simplified schematic for an RF buffer amplifier 300 consistent with an embodiment of the present invention. Included are switches S1 310, S2 320, S3 330, and 84 340, inductive load L1 350, and capacitor C10 355. Inductor L1 350 and capacitor C10 355 form a tank circuit. The capacitor C10 355 may be a real capacitor, it may be the capacitance of the switches plus the capacitance of the interconnect between the inductor and switches, or it may be a combination of the two. A first supply voltage VDD is applied on line 360. A second supply voltage VSS is applied an line 370. In one embodiment of the present invention VDD is equal to 1.8 V and VSS is ground or 0 Volts. Alternately, VDD may be other supply voltages. For example. VDD may be equal to 2.5 or 3.3 Volts. An output voltage is generated across the Inductive load L1 350. appearing at lines 380 and 390.

An input signal controls the state of the four switches. When the input has a first polarity, switches S4 340 and S1 310 are closed, and S2 320 and S3 330 are open. Current flows from VDD applied on line 360, through S1 310, through the tank circuit L1 350 and C10 355, into S4 340, returning to ground or VSS on line 370. When the input has a second polarity, S2 320 and S3 330 are closed while S1 310 and S4 340 are open. In this state current flows from the supply voltage VDD on line 360, through the switch S2 320, through the tank circuit L1 350 and C10 355, into switch S3 330, returning to ground or VSS on line 370. The change in current through the tank circuit L1 350 and C10 355 creates a voltage output between the lines 380 and 390.

This architecture improves on several of the drawbacks of the architecture of the conventional RF buffer shown in FIG. 1. The current supplied by VDD flows through the entire inductive load, first in one direction, then the other. In the circuit of FIG. 1, the current of the current source 150 flows first through one of two inductors, then the other inductor, that is, the current flows through only one half of the inductive load at a time. Embodiments of the present invention thus provide approximately a 50 percent power reduction for this reason.

Also, the conventional RF buffer wastes current when the input devices are both on. At this point, the rate of change of current is low, so the AC voltage out is not increased, though power is being dissipated. The circuit of FIG. 3 does not provide a common mode current signal to the inductor. The current flows one direction or the other, so the power is again reduced, by approximately 20 percent. This, along with the above 50 percent power savings, means that the circuit in FIG. 3 provides the same output swing as the conventional RF buffer of FIG. 1, while dissipating approximately 40 percent of the power. In other words, the circuit of FIG. 3 provides approximately a 60 percent reduction in power over a conventional RF buffer.

Figure 4:
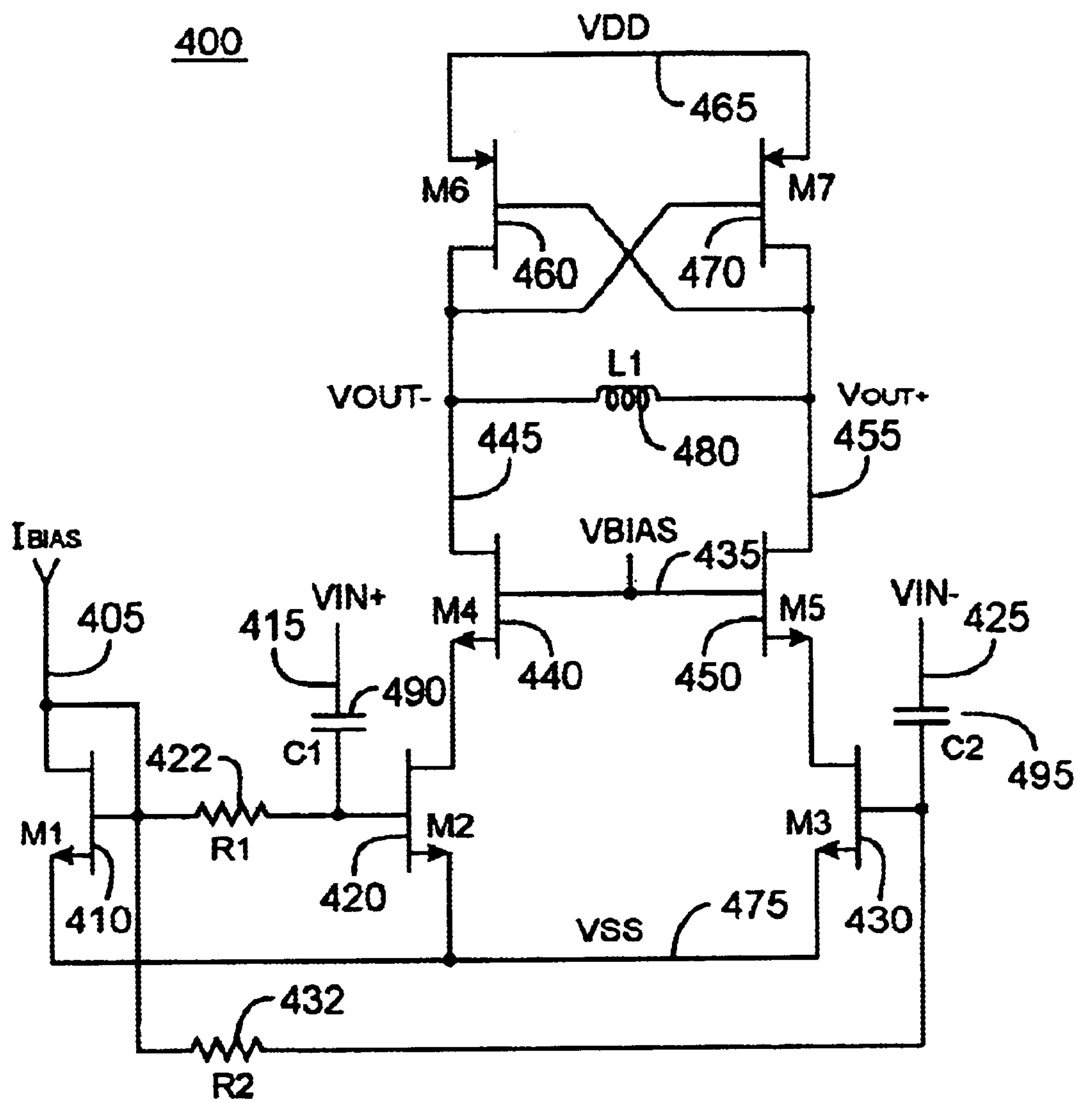
FIG. 4 is a schematic of an RF buffer amplifier consistent with one embodiment of the present invention.

FIG. 4 is a schematic of an RF buffer amplifier 400 consistent with one embodiment of the present invention. This RF buffer is typically formed on an integrated circuit. Included are input devices M2 420 and M3 430, cascode devices M4 440 and M5 450, inductive load L1 480, and M6 640 and M7 470, which are p-channel active loads in a positive feedback configuration. In an embodiment of the present invention, M1 is an NMOS device having an approximate size of 5/0.18, where 5 is the device width, and 0.18 is the device length. In that embodiment, M2, M3, M4, and M5 are NMOS devices each having an approximate size of 20/0.18, M6 and M7 are PMOS devices each having an approximate size of 50/0.18, and the inductor has an approximate value of 6 nH with a Q of approximately 8–10. The inductor L1 is typically on-chip metal traces formed in spiral shapes. Alternately, the inductor L1 480 may be off-chip. The inductor L1 480, together with the capacitance across it, forms a tank circuit. This capacitance includes the drain capacitances of M4 440, M5 450, M6 460, and M7 470, the drain to gate capacitances of the same devices, the plate and fringe capacitance of the metal interconnect of lines 445 and 455, as well as the parasitic capacitance of the inductor L1 480. The capacitance may also include an on-chip capacitor.

It will be obvious to one skilled in the art that modifications can be made to this schematic consistent with embodiments of the present invention, For example, this schematic can be "inverted", with p-channel (PMOS) input devices, and n-channel (NMOS) loads. Moreover, bipolar npn transistors may replace some or all of the NMOS devices, and bipolar pnp transistors may be used instead of the PMOS devices. Also, the cascode devices M4 440 and M5 450 provide a high degree of isolation between the input and output. If a VCO is generating the input voltage, this isolation is useful in avoiding kickback from the output into the VCO. But in applications not requiring this isolation, the circuit may be simplified by removing M4 440 and M5 450. This figure, as all the figures included, are for exemplary purposes only, and do not limit the scope of the invention or the claims.

Biasing circuitry including M1 410, R1 422, R2 432, and input capacitors C1 490 and C2 495, are also included. A first supply voltage, VDD, is applied on line 465. A second supply voltage, VSS, is applied on line 475. In one embodiment of the present invention the supply voltage VDD is equal to 1.8 Volts, and the supply voltage VSS is equal to ground or 0 Volts. In other embodiments, VDD may be equal to other supply voltages. For example, VDD may be equal to 2.5 or 3.3 Volts. Alternately, VDD may be grounded while VSS is a negative voltage, such as −1.8 Volts. Each side of a differential input voltage signal is applied to one node of the capacitors C1 490 and C2 495. An input bias current, Ibias, is applied on line 405 to the diode connected device M1 410. This current is mirrored by the input devices M2 420 and M3 430. The bias voltage Vbias is applied to the gates of cascode devices M4 440 and M5 450 on line 435. In an embodiment of the present invention this bias line is connected to the VDD supply voltage on line 465. Alternately, this bias line may be coupled to other voltages.

In the absence of an AC signal at input nodes 415 and 425, the DC bias conditions of this RF buffer are as follows. A relatively small current is applied to the Ibias line 405, thus generating a Vgs for device M1 410 that is very near its threshold voltage, Vt. Since there is no current flow through resistors R1 422 and R2 432, the Vgs for devices M2 420 and M3 430 are equal to the Vgs of device M1 410. Ibias is mirrored by devices M2 420 and M3 430 and flows through cascode devices M4 440 and M5 450. To reduce power, M1 410 can be scaled relative to M2 420 and M3 430. For example, an embodiment of the present invention scales the devices in a 1:4 ratio, such that M2 420 and M3 430 conduct a DC bias current of approximately 10–100 uA, while M1 410 conducts one-fourth that amount. If the gates of M4 440 and M5 450 are tied to VDD, the sources of the cascode devices are a Vgs below VDD, which is approximately equal to VDD minus Vt. The current in cascode devices M4 440 and M5 450 flow through p-channel devices M6 460 and M7 470. The Vgs of these devices are likewise near their threshold voltage. Accordingly the DC voltages at the outputs lines 445 and 455 are equal to VDD minus Vt.

Again, a small bias current is applied to the Ibias line 405, which flows through device M1 to ground VSS. This current generates a gate-to-source voltage for device M1. If there is no AC input signal, this voltage is applied across the gate to source of devices M2 420 and M3 430. Devices M2 420 and M3 430 are conducting under these conditions. Alternately, input devices M2 420 and M3 430 may be biased such that they are below the conducting threshold. When an input signal is applied, one of the input devices is turned on and begins conducting current, while the other device shuts off, or remains off, and does not conduct current. The current flows through one of the cascode devices and through the inductive load L1 480. The current flow in L1 480 generates a voltage such that one of the active loads M6 460 and M7 470, which are configured in a positive feedback connection, turns on, supplying current through L1, while the other shuts off.

Specifically, if the input swings positive, the voltage at the gate of device M2 420 increases, while the gate voltage of the input device M3 430 decreases. Input device M2 420 turns on and conducts current, while input device M3 430 shuts off. The current in M2 420 flows through cascode device M4 440, through inductor L1 480 in the direction from right to left as shown in the Figure. This change in current develops a voltage at the output between nodes 455 and 445 such that the voltage on line 455 increases, and the voltage on line 445 decreases. As the voltage on line 445 decreases, device M7 470 turns on and begins to conduct. As the voltage on line 455 increases, the gate-to-source voltage of device M6 460 decreases, shutting that device off. Device M7 470 conducts current through the inductor L1 480, through cascode M4 440, and back to the input device M2 420. The p-channel device M7 470 generates a current through L1 480 in the same right to left direction, thus increasing the output voltage across the inductor L1 480.

It is interesting to note that as the voltage on line 445 decreases, device M7 470 turns on harder, and provides more current to the inductive load L1 480. As the device M7 470 provides more current, the output voltage on line 455 increases at a faster rate and the voltage on line 445 decreases at a faster rate, which turns on M7 470 at an even faster rate. This mechanism is referred to as positive feedback, and accounts for the very high performance of this circuit. Also, this feedback path, where a current from the input device M2 420 results in a "re-use" current in M7 470, provides a 50 percent power savings over conventional RF buffers.

Figure 5:
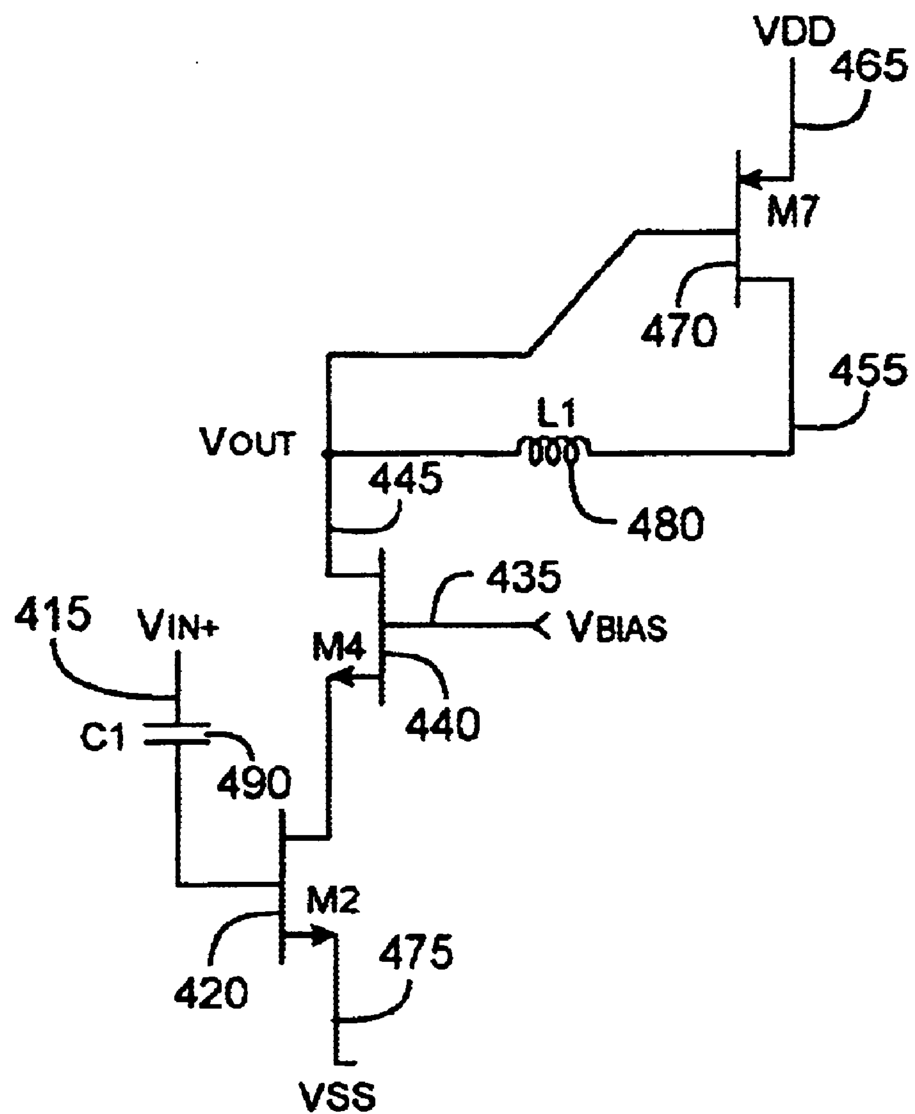
FIG. 5 is a schematic showing the circuit components in a current path of the circuit shown in FIG. 4.

FIG. 5 is a schematic showing the circuit components in the current path discussed above. Again, as the input voltage increases, the voltage on line 415 increases, and the gate voltage of device M2 420 increases. Device M2 420 conducts an increasing amount of current which flows through cascode device M4 440. This current flows through inductor L1 480. Accordingly, the voltage at line 445 decreases, while the voltage at line 455 increases. This decreasing voltage at line 445 turns on device M7 470, which conducts current back through inductor L1 480. Again, as the voltage on line 445 continues to decrease, the device M7 470 turns on harder, thus increasing the voltage at 455 and decreasing voltage at 445 at an increasing rate.

Returning to FIG. 4, as the input voltage swings the other way and becomes negative, device M3 430 conducts and device M2 420 shuts off. The current in device M3 430 flows through cascode device M5 450 and into the inductor L1 480 in the direction opposite to the existing current flow, and also through device M7 470, which is still conducting. The voltage on line 455 begins to decrease, while the voltage at line 445 increases. This acts to shut off device M7 470, and turns on device M6 460, thus reversing the current flow in inductor L1 480.

Figure 6:
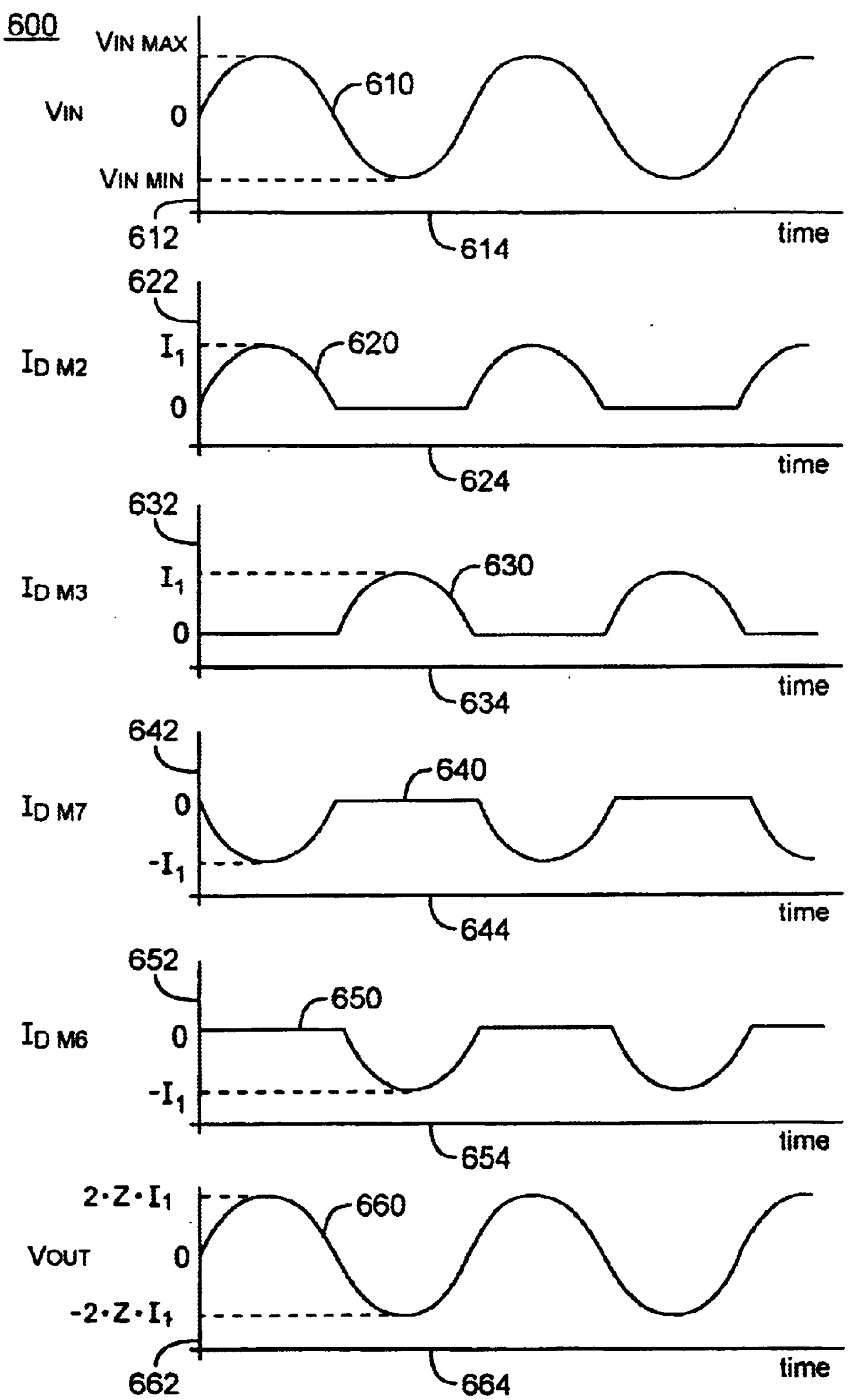
FIG. 6 illustrates the current and voltage waveforms and at some of the nodes in the circuit of FIG. 4.

FIG. 6 illustrates the current and voltage waveforms at some of the nodes in the circuit of FIG. 4. Input voltage waveform 610 is plotted as a function of time along X axis 614. Input waveform 610 is an example of a signal Vin which may be applied between lines 415 and 425. Input waveform 610 has an average value of zero, a peak voltage of Vinmax, and a minimum voltage of Vinmin. Input waveform 610 is shown as being approximately sinusoidal, as if generated by a voltage controlled oscillator (VCO) or similar circuit.

When Vin is high, that is, Vin is between the values of Vinmax and approximately zero, a current is generated in the drain of device M2. When Vin is negative, that is, Vin has a value between approximately zero and Vinmin, the drain current of device M2 is approximately zero. As waveform 610 increases, the drain current in M2 increases geometrically and reaches a maximum value shown here as I1.

The drain current of device M3 in shown as waveform 630. When Vin 610 is positive, the drain current in device M3 is approximately zero. When the input voltage Vin 610 is negative, that is, Vin is approximately between zero Volts and Vinmin, drain current flows in device M3. When the voltage Vin is negative, the drain current in device M3 is geometrically proportional to the inverse of the input voltage 610. Current waveform 630 is plotted as a function of time along X axis 634.

When current flows in the drain of device M2, the current flows through cascode device M4, thus pulling down the voltage at line 445. Accordingly, device M7 begins to turn on, and a drain current in device M7, shown as waveform 640, begins to flow. The finite transit time of M7 means that waveform 640 is delayed in time from waveform 620, though for simplicity it is shown as being in phase in this figure. Waveform 640 is shown as a function of time along X axis 644.

When current flows in the drain of device M3, the current flows through cascode device M5, thus pulling down the voltage at line 455. Accordingly, device M6 begins to turn on, and a drain current in device M6, shown as waveform 650, begins to flow. Again, waveform 650 is delayed in time from waveform 630, though for simplicity it is shown as being in phase. Waveform 650 is shown as a function of time along X axis 654.

As can be seen, when Vin 610 is high, devices M2 and M7 conduct current through the inductor L1 480 from right to left as shown in FIG. 4, from line 455 to line 445. When Vin is low, current flows in devices M3 and M6, resulting in a current flow through the inductor L1 480 from left to right as shown in FIG. 4, from line 445 to line 455. This alternating current through the inductive load L1 480 generates a voltage between lines 455 and 445 shown as waveform 660. Waveform 660 is plotted as a function of time along the X axis 664. The peak voltage output is approximately two times the impedance of the inductor times the peak current through the inductor, which is I1. The minimum voltage output is approximately negative two times the impedance of the inductor times the peak current through the inductor. The average value of the waveform is zero. If the frequency of the input waveform 610 is equal to the resonant frequency of the tank formed by the inductor L1 and the capacitance across it, the output voltage waveform 660 is in phase with the current through the inductor.

The peak power dissipation of this circuit is I1 times the supply voltage VDD. If the waveform Vin is sinusoidal, the current waveforms in the drains of devices M2, M3, M7, and M6 are proportional to the square of the input voltage. The average power dissipation of the circuit is equal to the sum of the drain current in devices M6 and M7 times VDD. If the circuit is unloaded, this power dissipation is equal to the sum of the currents in devices M2 and M3 times VDD. This is approximately equal to 0.8 times I1 times VDD.

This compares favorably to the conventional RF buffer shown in FIG. 1. The circuit in FIG. 4 reuses the current in the input devices M2 and M3, by generating currents in devices M6 and M7. Accordingly, for the same output voltage swing, only half of the current is needed. Also, there is additional current savings since the average current is less than I1. That is, the average current is less than the peak current through the inductor. In the conventional RF buffer circuit of FIG. 1, the peak current through the inductive load is equal to the current source 150, so the average current is equal to the peak current through the inductor. In the circuit of FIG. 4 the average current is only approximately 80 percent of the peak current through the inductor.

This can be understood graphically by examining the current waveforms 620, 630, 640, and 650 at the times when the input voltage 610 is zero. The total current of all waveforms at that time is near zero. Again, in the conventional buffer of FIG. 1, the total current is never zero, but stays constant at ICS. Also, if the currents were sinusoidal, the average current would be 0.707 times the peak current through the inductor. But the current waveforms are geometrically proportional to the input, so an approximation of 0.8 is more accurate. Thus, the total power of circuit in FIG. 4 is 0.8 times a one half, or 0.4 that of the conventional buffer. In other words, the circuit of FIG. 4 dissipates only approximately 40 percent the power of the circuit shown in FIG. 1.

The circuit of FIG. 4 also has a large output swing. The DC bias point for the output lines 445 and 455 in FIG. 4 is approximately a Vt below VDD. The lowest each output line can swing is approximately ground, meaning that each line can swing approximately two times VDD minus Vt, for a total output swing of four times VDD minus Vt. For example, as line 455 goes low, M5 450 enters the triode region, and its Vgs becomes larger. When the Vgs of device M5 450 is approximately VDD, device M3 begins to shut off and does not supply current to the inductor L1 480, thus limiting its swing.

Figure 7:
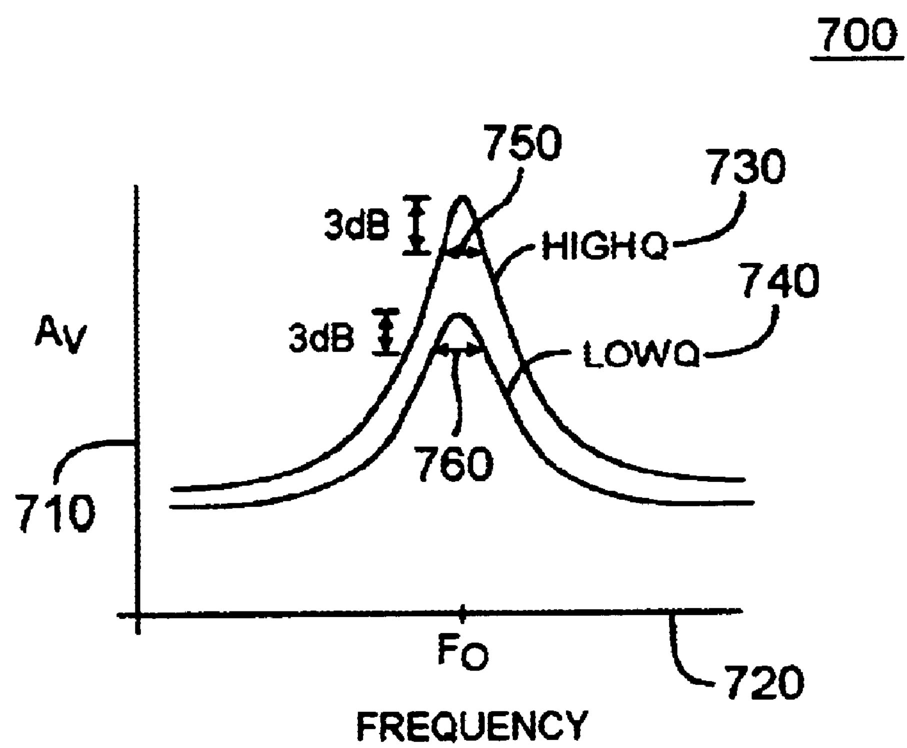
FIG. 7 shows the gain of the circuit of FIG. 4 as a function of frequency.

FIG. 7 shows the gain of the circuit of FIG. 4 as a function of frequency. Shown are the gain of the circuit with a high Q 730 and a low Q 740. The Q of the circuit can be changed by adjusting the load seen at the output. Specifically, a resistive load decreases the Q, and if the output is unloaded, the Q is high. The Q of the high-Q gain curve 730 is equal to the difference in frequency of the minus 3 dB points shown as 750, divided by the center frequency F0. The Q of the low-Q gain curve 740 is the difference in frequency between the minus 3 dB points, 760, divided by the center frequency F0.

Since the inductor provides a short at DC, there is no gain at low frequencies. As the frequency increases, the inductor impedance increases, and the gain of the circuit increases. At some point the impedance of the inductor, and the impedance of the capacitance seen by the inductor are equal. At this frequency the circuit is tuned, and is at its maximum gain. At still higher frequencies, the capacitor attenuates the output signal, and the gain declines.

Designing the buffer such that it is tuned to the frequency of the input voltage imparts several important benefits. Specifically, signals at other frequencies, such as noise and cross talk, have a lower gain, and thus are comparatively, or actually attenuated. Also, the circuit acts as a bandpass filter, thus the output waveforms tend to be sinusoidal. This is important when driving some circuits, including polyphase filters.

Figure 8:
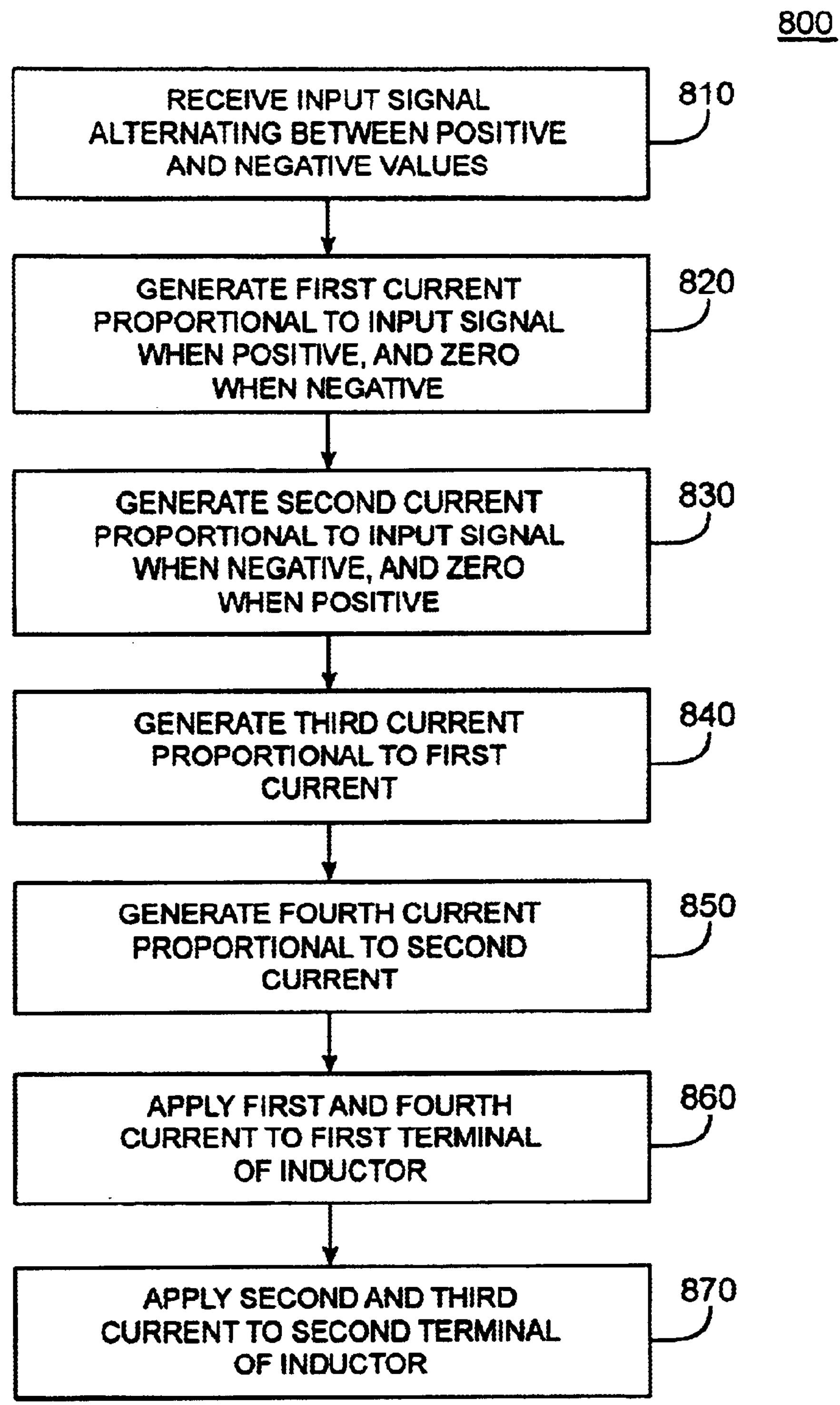
FIG. 8 is a flow chart of a method of buffering an RF signal consistent with an embodiment of the present invention.

FIG. 8 is a flow chart 800 of a method of buffering an RF signal consistent with an embodiment of the present invention. In act 810, an input signal which alternates between positive and negative values is received. A first current that is proportional to the input signal when input signal is positive, and zero when input signal is negative, is generated in act 820. A second current that is proportional to the input signal when input signal is negative, and zero when input signal is positive, is generated in act 830. The first current and the second current may be geometrically proportional, or exponentially proportional to the input signal. In act 840, a third current proportional to the first current is generated. A fourth current proportional to the second current is generated in act 850. The first and fourth currents are applied to a first terminal of the inductor, and the second and third currents are applied to a second terminal of the inductor in acts 860 and 870, respectively.

Figure 9:
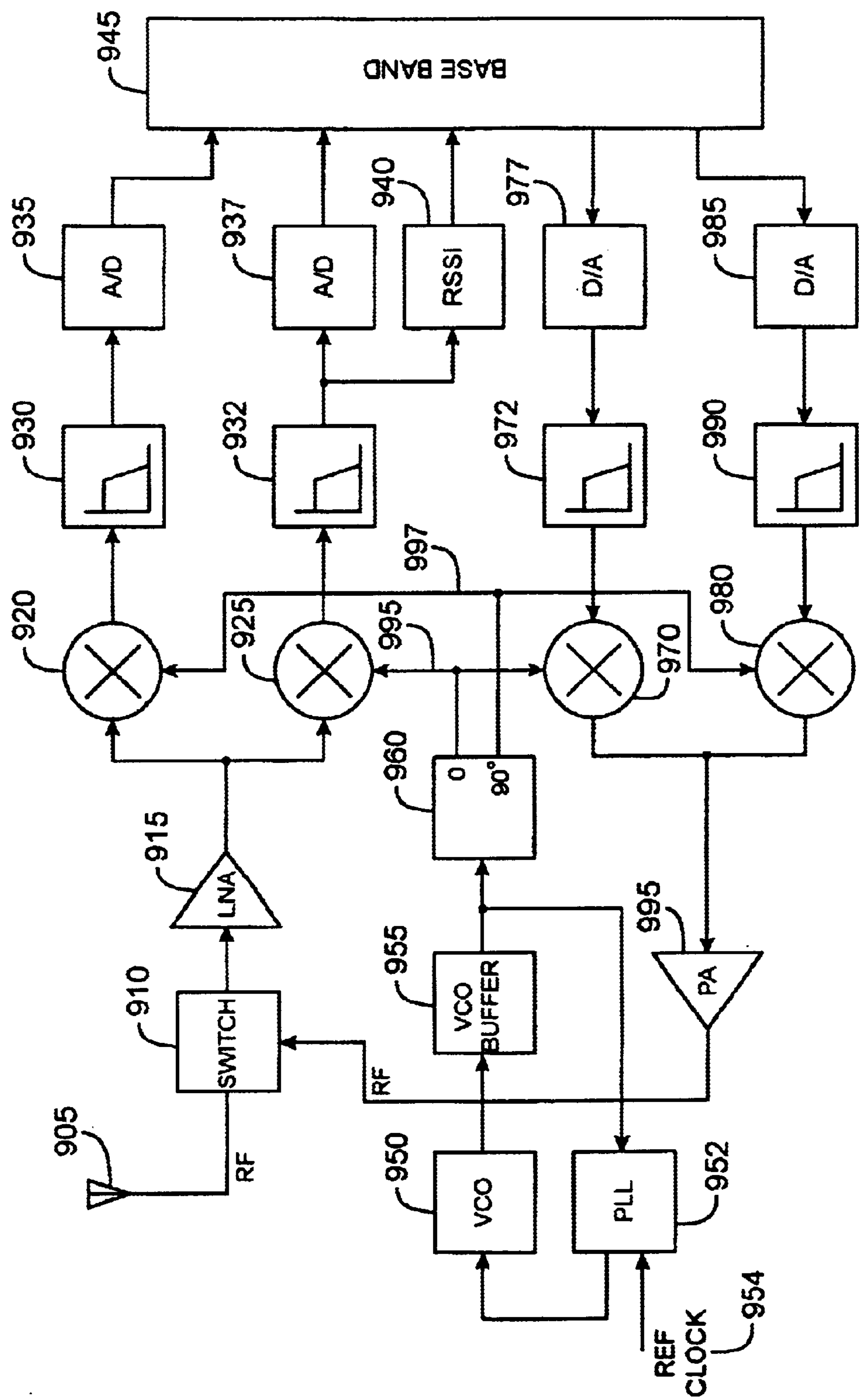
FIG. 9 is a block diagram for a wireless transceiver that may make use of RF tuned amplifiers consistent with embodiments of the present invention.

FIG. 9 is a block diagram for a wireless transceiver that may make use of RF tuned amplifiers consistent with embodiments of the present invention. For example, the VCO buffer block 955 may use of such an RF tuned buffer amplifier.

Included in block diagram 900 are an antenna 905, a switch 910, low noise amplifier 915, downconverter mixers 920 and 925, low pass filters 930 and 932, analog to digital (A/D) converters 935 and 937, RSSI block 940, baseband circuit 945, digital to analog (D/A) converters 977 and 985, low pass filters 972 and 990, upconverter mixers 970 and 980, power amplifier 995, voltage controlled oscillator (VCO) 950, VCO buffer 955, PLL 952, and polyphase filter 960. Most of the circuits are typically formed on an integrated circuit, though the antenna may be off-chip, and the baseband may be on a separate integrated circuit.

VCO 950 generates a local oscillator (LO) signal having a frequency near that of the signal to be received on antenna 905. VCO buffer 955 filters and amplifies the LO signal from the VCO and provides it to polyphase filter 960 and PLL 952. PLL 952 typically includes dividers and a frequency synthesizer. The PLL 952 receives a reference clock 954 which is generated by a crystal or other similar stable frequency source, compares its phase to that of a divided down version of the LO signal, and provides a control voltage to the VCO 950. Polyphase filter provides quadrature signals of the LO signal to the transmit and receive mixers. In the receive mode, the received signal appears at antenna 905, and is coupled through the switch 910 to the low noise amplifier 915. The signal is amplified, and provided to the downconverter mixers 920 and 925, which generate incident and quadrature intermediate frequency (IF) signals. The IF signals are filtered by low pass filters 930 and 932, and are digitized by A/D converters 935 and 937, and provided to the baseband 945. Baseband 945 typically includes a modem and digital signal processing (DSP) circuits.

The amplitude of the IF signal provided by the downconverter is detected by RSSI block 940 and presented to the baseband circuit 945. The RSSI block 940 may receive an input from one or both of the outputs of the low pass filters 930 and 932. Alternately, or in combination, the RSSI block may receive an input from one or both of the outputs of the mixers 920 and 925. RSSI block 940 may contain logarithmic amplifiers and rectifiers. Examples of such logarithmic amplifiers can be found in jointly assigned, copending U.S. application Ser. No. 09/836,624, filed Apr. 16, 2001, titled "Logarithmic IF Amplifier with Dynamic Large Signal Bias Current, which is hereby incorporated by reference.

In the transmit mode, baseband circuit 945 provides digitized IF signals to D/A converters 977 and 985, which provide analog IF signals to the low pass filters 972 and 990. The transmit mixers upconvert the IF signals to the RF frequency, where it is gained up by power amplifier 995, and presented for transmission through the switch 910 to the antenna 905.

Figure 10:
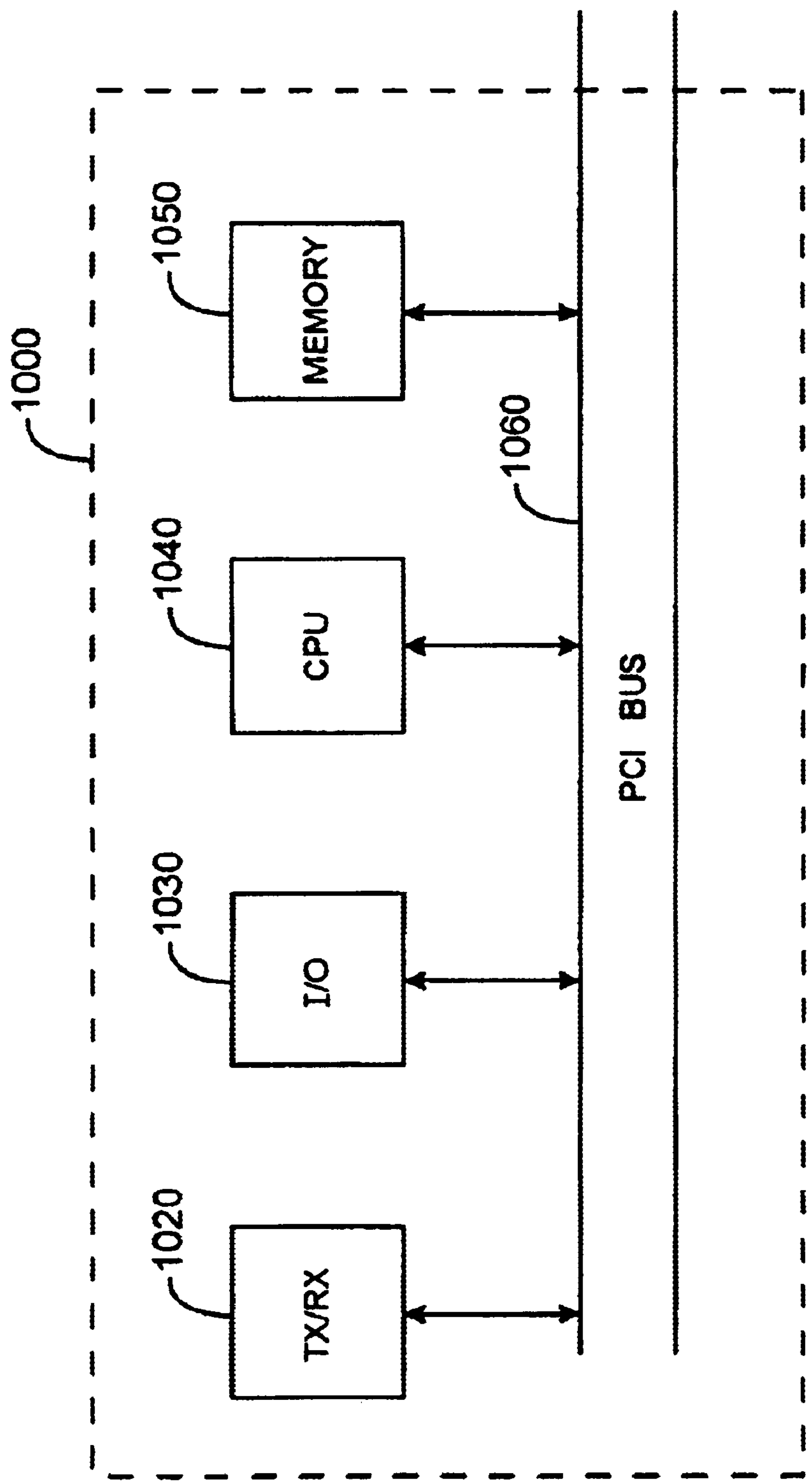
FIG. 10 shows a simplified block diagram for one example of an electronic system including circuit blocks using RF tuned amplifiers according to the present invention.

The tuned RF amplifier as embodied in the transceiver of FIG. 9 allows for implementation of various electronic systems that are capable of wireless RF communication. Such electronic systems include desktop and laptop personal computers, mobile telephone, television and internet devices, home gateways and media servers, portable digital music devices, data pipes, and the like. FIG. 10 shows a simplified block diagram for such an electronic system. As an example, a desktop personal computer 1000 is shown. Personal computer 1000 includes a central processing unit (CPU) 1040, memory 1050, input/output devices 1030, and transceiver 1020, coupled to a common personal computer interface (PCI) bus 1060. Alternately, transceiver 1020 may be incorporated into input/output devices 1030. Transceiver 1020 is of the type described above in connection with FIG. 9. Transceiver 1020 allows system 1000 to wirelessly communicate with other RF wireless devices.

Embodiments of the present invention have been explained with reference to particular examples and Figures. Other embodiments will be apparent to those of ordinary skill in the art. Therefore, it is not intended that this invention be limited except as indicated by the claims.

What is claimed is:

1. A circuit for buffering RF signals comprising:

a first device coupled between a first output node and a first supply node, having a control electrode coupled to a first input node;

a second device coupled between a second output node and the first supply node, having a control electrode coupled to a second input node;

a third device coupled between a second supply node and the first output node, having a control electrode coupled to the second output node;

a fourth device coupled between the second supply node and the second output node, having a control electrode coupled to the first output node;

a fifth device coupled between the first device and the first output node;

a sixth device coupled between the second device and the second output node;

a seventh device coupled between a current source and the first supply node, having a control electrode coupled to the first input node and the second input node; and an inductor coupled between the first output node and the second output node.

2. The circuit of claim 1 wherein the first device and the second device are NMOS devices, and the third device and fourth device are PMOS devices.

3. An integrated circuit, wherein die integrated circuit comprises the circuit of claim 2.

4. A transceiver comprising the circuit of claim 2.

5. The circuit of claim 1 wherein the seventh device receives a current from the current source and biases the first device and the second device.

6. The circuit of claim 5 wherein the first device and the second device are biased to have DC gate-to-source voltages approximately equal to their threshold voltages.

7. A computing device comprising:

a memory;

a central processing unit coupled to the memory; and the transceiver of claim 4 coupled to the central processing unit.

8. A method of buffering an RF signal comprising;

receiving the RF signal, wherein the RF signal alternates between a first polarity and a second polarity;

generating a first current, wherein the first current is proportional to the RF signal when the RF signal has the first polarity, and approximately equal to zero when the RF signal has the second polarity;

generating a second current, wherein the second current is proportional to the RF signal when the RF signal has the second polarity, and approximately equal to zero when the RF signal has the first polarity;

using the first current to generate a third current, the third current proportional to the first current;

using the second current to generate a fourth current, the fourth current proportional to the second current;

applying the first and fourth currents to a first terminal of an inductor; and applying the second and third currents to a second terminal of the inductor, wherein the first current is geometrically proportional to the RF signal when the RF signal has the first polarity, and the second current is geometrically proportional to the RF signal when the RF signal has the second polarity.

9. The method of claim 8 wherein a first terminal of a capacitor is coupled to the first terminal of the inductor.

10. The method of claim 9 wherein a second terminal of the capacitor is coupled to the second terminal of the inductor and the capacitor and inductor form a tank circuit.

11. The method of claim 10 wherein the RF signal alternates between the first polarity and the second polarity at a first frequency, the tank circuit has a resonant frequency at a second frequency, and first frequency and second frequency are approximately equal.

12. The method of claim 9 wherein the first current and the second current are generated by transistors that are biased to have DC gate-source voltages approximately equal to their threshold voltages.

13. A circuit for amplifying RF signals comprising:

a first device coupled between a first output node and a first supply node, having a control electrode coupled to a first input node;

a second device coupled between a second output node and the first supply node, having a control electrode coupled to a second input node;

a third device coupled between a second supply node and the first output node, having a control electrode coupled to the second output node;

a fourth device coupled between the second supply node and the second output node, having a control electrode coupled to the first output node;

a fifth device coupled between a current source and the first supply node, having a control electrode coupled to the first input node and the second input node; and an inductor coupled between the first output node and the second output node.

14. The circuit of claim 13 wherein the first device, the second device, and the fifth device are NMOS device; and the third device and fourth device arc PMOS devices.

15. The circuit of claim 13 wherein the fifth device receives a current from the current source and biases the first device and the second device.

16. The circuit of claim 15 wherein the first device and the second device are biased to have DC gate-to-source voltages approximately equal to their threshold voltages.

* * * * *